(12) United States Patent
Shapira

(10) Patent No.: US 7,152,317 B2
(45) Date of Patent: Dec. 26, 2006

(54) CIRCUIT FORMING METHOD

(76) Inventor: Shmuel Shapira, 14383 Holly Springs Rd., Lake Oswego, OR (US) 97035

(*) Notice: Subject to any disclaimer, the term of this patent is extended or adjusted under 35 U.S.C. 154(b) by 140 days.

(21) Appl. No.: 10/912,849

(22) Filed: Aug. 6, 2004

(65) Prior Publication Data

US 2005/0064652 A1    Mar. 24, 2005

Related U.S. Application Data

(60) Provisional application No. 60/494,031, filed on Aug. 8, 2003.

(51) Int. Cl.
*H05K 3/02* (2006.01)
(52) U.S. Cl. .............................. 29/846; 29/825; 29/847
(58) Field of Classification Search .................. 29/825, 29/846, 847
See application file for complete search history.

(56) References Cited

U.S. PATENT DOCUMENTS

| | | | |
|---|---|---|---|
| 220,546 A | 10/1879 | Patten | |
| 2,622,054 A | 12/1952 | Franklin | |
| 2,716,268 A | 8/1955 | Steigerwalt | |
| 2,905,539 A | 9/1959 | Bowerman | |
| 2,972,003 A | 2/1961 | Greenman et al. | |
| 2,986,804 A | 6/1961 | Greenman et al. | |
| 3,010,863 A | 11/1961 | Coe et al. | |
| 3,239,915 A | 3/1966 | McGinley et al. | |
| 3,301,730 A | 1/1967 | Spiwak et al. | |
| 3,410,743 A | 11/1968 | Smith, Jr. et al. | |
| 3,573,126 A | 3/1971 | Kougel | |
| 3,685,144 A | 8/1972 | Trimble | |
| 4,091,125 A | 5/1978 | Delgadillo | |
| 4,394,709 A * | 7/1983 | Brower et al. | 361/762 |
| 4,394,710 A * | 7/1983 | Brower et al. | 361/762 |
| 4,494,100 A | 1/1985 | Stengel et al. | |
| 4,546,065 A * | 10/1985 | Amendola et al. | 430/313 |
| 4,552,615 A * | 11/1985 | Amendola et al. | 216/44 |
| 4,613,843 A | 9/1986 | Esper et al. | |
| 4,614,837 A * | 9/1986 | Kane et al. | 174/257 |
| 4,682,415 A | 7/1987 | Adell | |
| 4,912,844 A * | 4/1990 | Parker | 29/848 |
| 5,014,420 A * | 5/1991 | Howard et al. | 29/846 |
| 5,375,322 A | 12/1994 | Leeb | |
| 5,447,779 A | 9/1995 | Imaichi et al. | |
| 5,583,474 A | 12/1996 | Mizoguchi et al. | |
| 5,652,561 A | 7/1997 | Inoh et al. | |
| 5,718,789 A | 2/1998 | Gebhardt et al. | |
| 5,761,801 A | 6/1998 | Gebhardt et al. | |
| 5,801,521 A | 9/1998 | Mizoguchi et al. | |
| 5,928,767 A | 7/1999 | Gebhardt et al. | |
| 5,980,679 A | 11/1999 | Severin et al. | |
| 6,091,607 A | 7/2000 | McKeown et al. | |
| 6,161,276 A | 12/2000 | Droz | |
| 6,175,293 B1 | 1/2001 | Hasegawa et al. | |
| 6,176,010 B1 | 1/2001 | Droz | |
| 6,308,406 B1 | 10/2001 | Gill et al. | |
| 6,369,684 B1 | 4/2002 | Iida et al. | |
| 6,404,317 B1 | 6/2002 | Mizoguchi et al. | |
| 6,444,366 B1 * | 9/2002 | Kawano et al. | 429/241 |
| 6,593,841 B1 | 7/2003 | Mizoguchi et al. | |
| 2001/0011948 A1 | 8/2001 | Rasband | |
| 2003/0112202 A1 | 6/2003 | Vogt | |

\* cited by examiner

*Primary Examiner*—Carl J. Arbes
(74) *Attorney, Agent, or Firm*—Kolisch Hartwell, P.C.

(57) ABSTRACT

A system and method of forming a circuit. The system and method includes layering an impressionable material and a conductive material, defining adjacent charge paths on the conductive material, and shaping the impressionable material to increase a gap between adjacent charge paths.

33 Claims, 11 Drawing Sheets

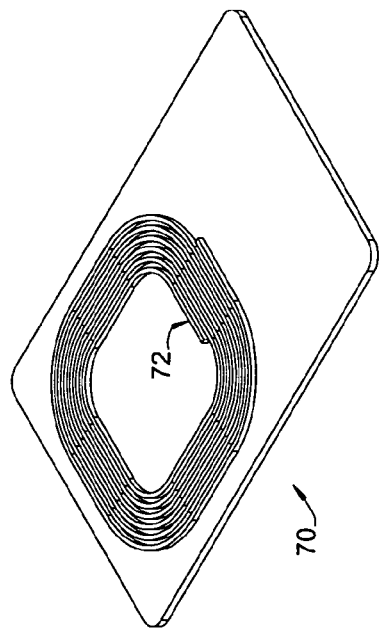
Fig. 6
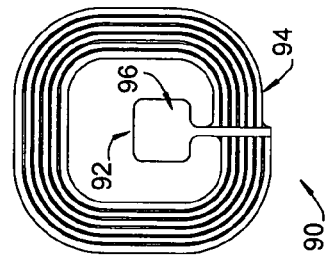
Fig. 7
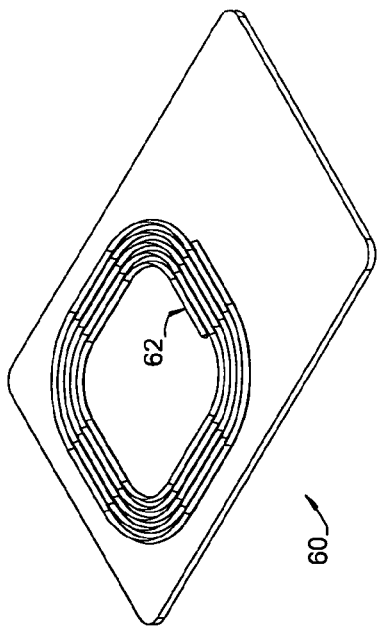
Fig. 8
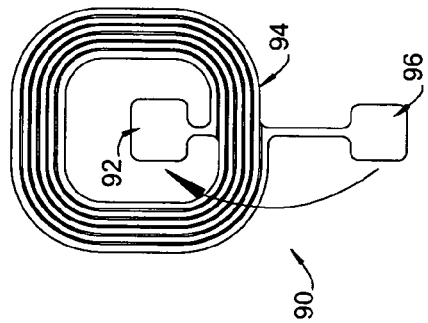
Fig. 9
Fig. 10

CIRCUIT FORMING METHOD

CROSS-REFERENCES

This application claims the benefit of U.S. Provisional Application No. 60/494,031, filed Aug. 8, 2003, which is incorporated by reference.

BACKGROUND

Until now it has been difficult to inexpensively and efficiently produce intricate circuits or conductive patterns. Such circuits can be used in RFID tags, smart labels and cards, electronic article surveillance tags, as well as in a variety of different devices. Many such circuits can include a planar coil or similar element.

BRIEF DESCRIPTION OF THE DRAWINGS

FIG. 6 somewhat schematically shows an exemplary die for defining a pattern on a conducting layer.

FIG. 7 somewhat schematically shows an exemplary template for shaping an impressionable layer.

FIG. 8 somewhat schematically shows an exemplary edge-cutting die for trimming a circuit.

FIGS. 9 and 10 somewhat schematically show an exemplary shaped circuit being folded.

DETAILED DESCRIPTION

The disclosed circuit forming method allows the use of inexpensive raw materials in their readily available form to form a variety of circuits, including coils suitable for use in RFID tags. Furthermore, unlike some other circuit forming methods, the disclosed method does not require the use of hazardous chemicals.

Figure 1:
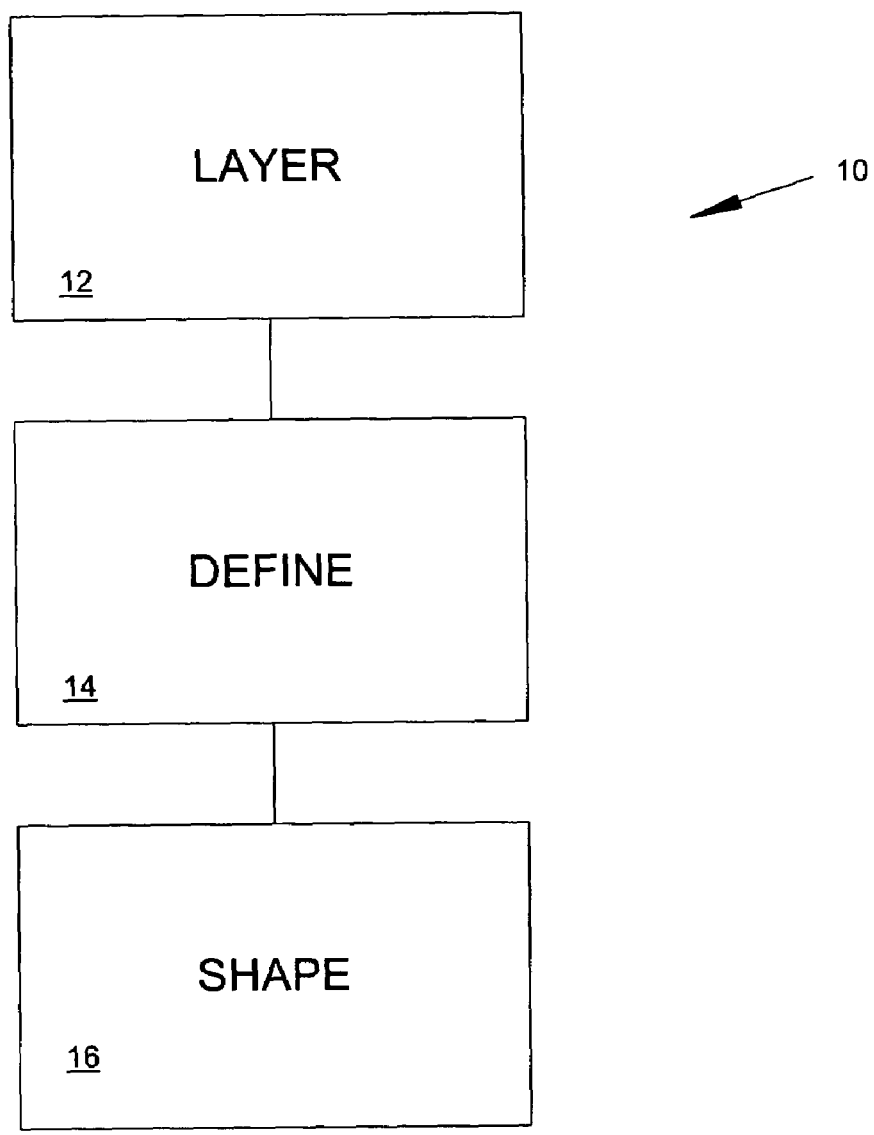
FIG. 1 schematically shows a method for forming a circuit.

FIG. 1 is a flow chart showing a circuit forming method 10 according to the present disclosure. As will be illustrated in the context of numerous examples below, the basic concepts of method 10 can be variously implemented. The disclosed circuit forming method is compatible with roll-to-roll production in which rolls of materials are continuously processed through circuit-forming machines. The disclosed circuit forming method is also compatible with machines that do not process rolls, but rather process one or more discrete sheets at a time.

As shown in FIG. 1, method 10 includes a layering step 12 in which at least a conductive layer and an impressionable layer are laminated together. In some embodiments, the conductive layer and the impressionable layer will be effectively fixed to one another, while in some embodiments the conductive layer and the impressionable layer will simply be placed next to one another. Other layers can also be laminated to the conductive layer or the impressionable layer, including between the conductive layer and the impressionable layer. The conducting layer and the impressionable layer may be layered together from two rolls to collectively form a web, or as discrete sheet assemblies that can be separately processed. In some embodiments, at least portions of the conducting layer and/or the impressionable layer can be precut before layering.

Method 10 also includes a defining step 14 in which one or more conductive paths are defined on the conductive layer. Such conductive paths can be formed by cutting a pattern into the conductive layer, scoring the conductive layer, or registering a stencil to the conductive layer for subsequent formation of defined charge paths. In some embodiments, defining can be accomplished via a die-cutting apparatus, which can be configured as a roller about which a web of the conductive layer can move. In some embodiments, a platen die cutting module may be used.

Method 10 further includes a shaping step 16 in which a distance between adjacent conductive paths is set to improve circuit integrity and/or performance. The distance can be increased by deforming the impressionable layer to which the conductive layer is laminated. As used herein, "shaping" means that the deformed position of the impressionable layer is retained so that the set gap between adjacent conductive paths is retained without the need for filling the gap while it is open. Increasing the distance between adjacent conductive paths can help decrease the likelihood of a short between adjacent charge paths. The gap distance can be set to maintain a required ratio between conducting and non-conducting areas for proper circuit performance, such as efficient inductive performance of a coil. Such shaping can be effectuated by an embossing die or template in some embodiments, which can take the form of a roller die or a platen die. The template may be selectively heated and/or cooled to facilitate shaping and/or setting of the impressionable layer.

EXAMPLE

Figure 2:
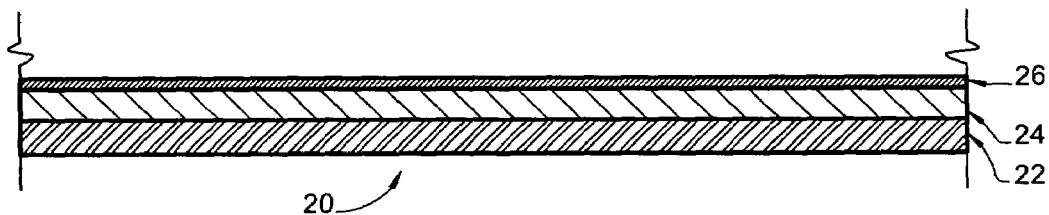
FIGS. 2–5 somewhat schematically show an exemplary method for forming a circuit.

FIGS. 2–5 schematically show a nonlimiting example of a method of shaping a conductive material into a desired pattern or circuit. FIG. 2 shows a cross section of a portion of a sheet material 20 that can be used to form a circuit. In the illustrated embodiment, the sheet material includes a substrate 22, an impressionable layer 24, and a conducting layer 26. It should be understood that circuits may be configured differently to include different materials, layers, shapes, etc. For example, in some embodiments, a single layer may serve as the impressionable layer and the substrate. Each constituent layer of the sheet material may come in the form of a roll, although flat or preshaped sheets or discrete elements are also within the scope of this disclosure.

Two or more of the various layers of sheet material 20 can be layered together. Layering can include adhering or otherwise joining the layers together, or the layers can simply be arranged next to one another. Adhesives may be applied between layers and/or heat may be applied to effectuate joining. When two or more layers are layered together, all such layers can be layered together at the same time or one or more layers can be layered at a different time than other layers.

When present, the substrate may include plastic and/or another poor electrical conductor. In some embodiments, the substrate may be flexible, and in some embodiments the substrate can be rigid. A flexible substrate may accommodate a roll-to-roll process in which rolls of the substrate material are used.

Conducting layer 26 can be formed from a conductive sheet material suitable for establishing one or more charge paths, through which electrical charge may move. In some embodiments, the conducting layer may include a metallic sheet material, such as an aluminum foil, copper foil, or another conductor. It should be understood that the conducting layer is not limited to the use of metal foils, but may include a metalized substrate, conductive polymers, etc. In general, the conducting layer can include virtually any combination of conductive and non-conductive materials in one or more layers that provide sufficient conductivity and suitable structural attributes for handling, cutting, shaping, and/or adhering to other layers. As with the substrate, a conducting layer that is at least partially flexible can facilitate roll-to-roll processing.

In the illustrated embodiment, impressionable layer 24 is intermediate substrate 22 and conducting layer 26. As explained below, in some embodiments, the impressionable layer may be a selectively deformable layer that can be given a desired profile. In other words, the impressionable layer can be made to hold a shape that is applied to the layer by pressure or some other shaping technique. The impressionable layer may include one or more materials in one or more layers. The impressionable layer can be shaped or formed by a variety of methods according to the particular type of impressionable layer that is used in a given embodiment. Pressure, ultrasonic vibrations, vacuum, and/or other methods may be used to shape the impressionable layer in a cold or hot process.

As one nonlimiting example, impressionable layer 24 may include a hot melt adhesive capable of adhering conducting layer 26 to substrate 22. Such a hot melt adhesive may be stamped, embossed, or otherwise physically altered to have a desired shape. In some embodiments, the impressionable layer may include a thermoplastic material and/or other meltable synthetic that becomes pliable when heat is applied. In some embodiments, the impressionable layer can be a coated layer of a material that does not necessarily need to start as a self supporting layer. In general, virtually any material, or combination of materials, that can hold an applied shape can be used. The thickness of the impressionable layer may be selected to achieve the desired final shape when an impression technique is applied.

Figure 3:
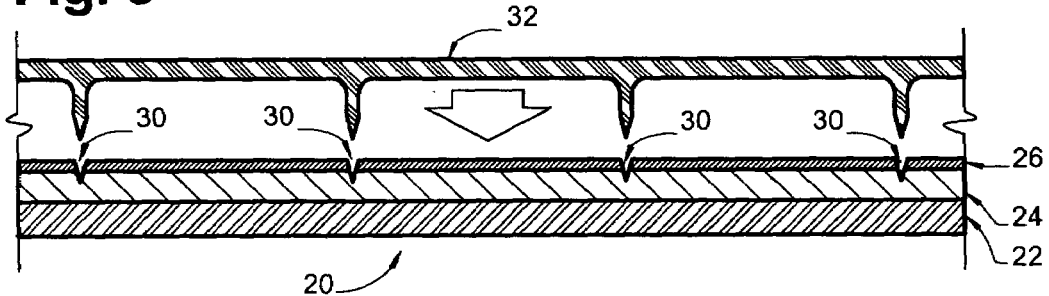

As shown in FIG. 3, a desired pattern can be defined on the conducting layer. As illustrated, the pattern may be formed by slitting selected portions of the conducting layer. For example, incisions 30 may be made in the conducting layer that effectively defines the layer with a desired pattern of conductive material. In some embodiments, such an incision need not cut completely through the conducting layer, but rather need only sufficiently alter the conducting layer so that subsequent shaping can form the desired slit. For example, the conducting layer can be partially scored so that subsequently applied pressure will cause the conducting layer to split along the score line. In some embodiments, a slit or score may not even be required, and the pattern can be formed by a bordering template that will allow a gap to be formed at pre determined areas of the conductive layer when the impressionable layer is swelling under pressure. Die cutting equipment, computer numerically controlled machinery, and/or other devices may be used to form a desired pattern. In some embodiments, two or more different devices may be utilized. A desired pattern can be formed in one step or by a progressive method in which the pattern is defined in two or more steps.

As a nonlimiting example, FIG. 3 shows a scorer 32 configured to mark a pattern on conducting layer 26. In the illustrated embodiment, the scorer includes a die cutting plate that is configured to physically cut through the conducting layer, and possibly a portion of the impressionable layer and/or the substrate. Cutting through the conducting layer effectively shapes the conducting layer into a desired conductive pattern. After a conductive pattern is defined, at least a portion of the impressionable layer and/or substrate may be left intact, thus providing a stable base for the newly formed conductive pattern. The conductive pattern can also be referred to as a charge path, which may include one or more portions, or traces, that run adjacent to one another. Such traces may collectively form a planar coil or other circuit element. Such traces can be separated by a gap distance D. After the scorer disengages the conducting layer, gap distance D may become very small or even closed.

Figure 4:
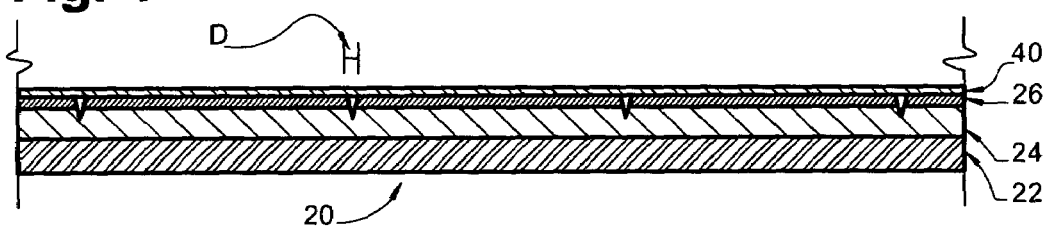

As shown in FIG. 4, a cover layer 40 may be applied on the conducting layer, or portions thereof. Cover layer 40 may include a dielectric layer, an insulating layer, and/or another suitable material for functionally protecting the conducting layer. Cover layer 40 and substrate 22 may cooperate to seal the conducting layer, or at least selected portions of the conducting layer. The cover can be selected and/or configured to resist breaking or tearing during processing. For example, at least a partially pliable material, such as flexible plastic, may be used to accommodate flexing and/or other mechanical strain.

In some embodiments, the cover layer may be laminated to the conducting layer. The cover layer can be applied before an impressionable layer is shaped or the cover layer can be applied after the impressionable layer is shaped. In some embodiments, a cover layer may itself be shaped or embossed to near its final shape before being applied to a conducting layer, thus reducing the chance that the cover layer will detrimentally stretch during subsequent processing.

Cover layer 40 may facilitate maintaining, or increasing, a desired gap distance D between adjacent traces of the conducting layer, although this is not required. Furthermore, in some embodiments, a pre-shaped cover layer may itself be used to shape the impressionable layer. A shaped cover layer may be rigid enough to be used as a template to impress a design onto the conducting layer, the impressionable layer, and/or the substrate: As such, the side of the cover layer facing the conducting layer can be configured to score a desired pattern in the conducting layer and/or to shape the impressionable layer. A cover layer may be pre-cut before its placement on the conducting layer to include areas where the conducting layer is exposed, thus enabling subsequent attachment of different elements directly to the conducting layer. Similarly, the cover layer can be kiss-cut (cutting selected layers without cutting through the entire sheet) after the cover layer has been placed on the conducting layer, thus providing access for placement of different elements to the conducting layer.

It should be understood that a cover layer is not required in all embodiments. Likewise, in some embodiments, other layers may additionally or alternatively be used to mechanically protect a circuit. Furthermore, a cover coat may be printed, sprayed, or otherwise applied to a conducing layer. However, unlike past methods which have relied on a sprayed layer to fill gaps and retain spacing between adjacent charge paths, the presently disclosed methods can retain gap spacing without such a filling. In some embodiments, additional elements of a conducting layer may be positioned on top of a cover layer prior to shaping.

Figure 5A:
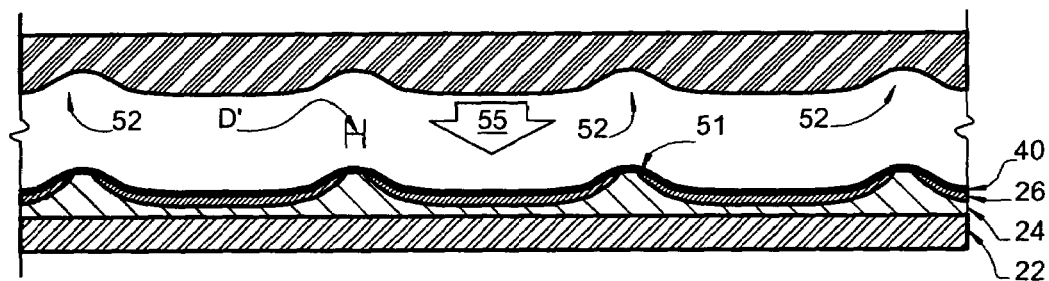

As shown in FIG. 5a, a template 50 may be used to further define the conductive pattern by shaping the impressionable layer. In some embodiments, the template may take the form of a heated embossing plate or die. The template may be configured with a stamping pattern 52 that complements the conductive pattern. The stamping pattern and the conductive pattern may be aligned so that troughs of the stamping pattern align with incisions 30. When so aligned, the stamping pattern may be pressed into the conductive pattern.

As shown, the conducting layer, impressionable layer, and/or cover layer may be deformed by the pressure of the template. In particular, the conducting layer may be given a more three-dimensional profile, which can increase a gap distance D' between adjacent traces of the conducting layer. The impressionable layer can hold the shape applied by the template, thus keeping the conductive pattern sufficiently defined. If not for the shaping of the impressionable layer, which includes the ability to retain the deformation applied by the template, the gap between adjacent traces of the conductive pattern could close, rendering the formed circuit less effective.

Figure 35:
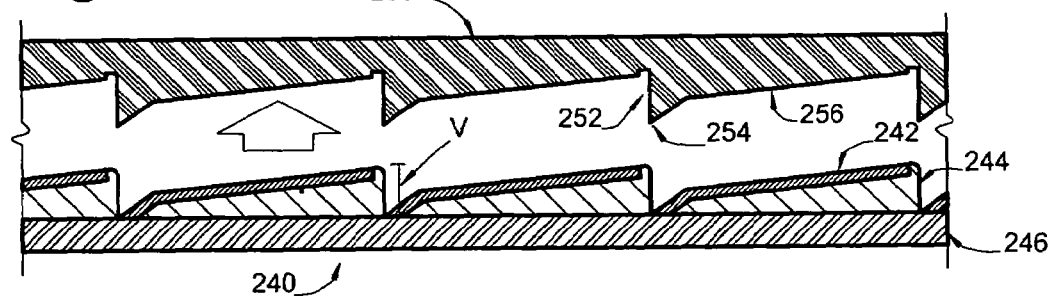

As demonstrated in FIG. 5a, an edge 51 of the conducting layer can rise when shaped. In other words, the edge of the conducting layer can move in the opposite direction of a stamping force (indicated at 55) that is applied by the template. Such an edge, which has risen as a result of the impressionable layer being shaped, can be referred to as an ascending edge. Depending on the shape of the template, all edges of the conducting layer can rise or alternating edges can rise while other edges sink, as shown in FIG. 35. In general, shaping can cause the impressionable material to facilitate movement of an edge in a direction which is different than a direction of exerted pressure by a cutting and/or stamping tool.

Alternative Template

Figure 5B:
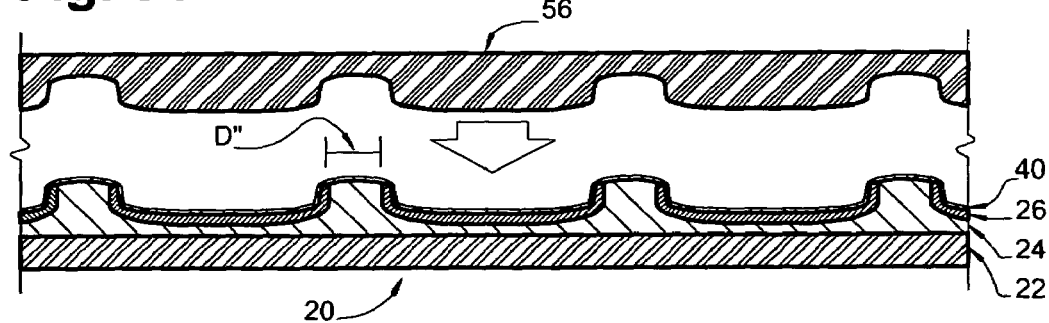

FIG. 5b shows another example of a template 56 that can be used to shape the impressionable layer and thus increase the gap distance between adjacent circuit traces. An increased gap distance may improve circuit integrity and help limit electrical shorts or other conditions that could cause a circuit to behave unpredictably. Different gap sizes can be achieved by using templates having different configurations. Template 56 is used to create a gap distance D". As can be seen by comparing FIG. 5a to FIG. 5b, the shape of the template can be used to create different gap distances. A gap may be perpendicular, at an angle, or parallel to a substrate, depending on the shape of the template. The templates shown in FIGS. 5a and 5b are nonlimiting examples of templates that can be used to shape an impressionable layer.

A template can include provisions for material overflow during shaping. The substrate may be perforated and/or allowed to flex in designated areas to accommodate material overflow during shaping.

Heat may by applied to soften an impressionable material prior to and/or during shaping. Heat may be applied, if necessary, through a heated base, through the template, through flow of hot air, and/or otherwise. A heated embossing die may be used to heat the conducting layer and at least some of the impressionable material which is located under and around the die. Even partial heating may be satisfactory in some embodiments, because portions that are heated can flow under the heated conducting layer and on top of the less heated impressionable material. In some embodiments, shaping may include ultrasonic vibration with or without heat. Ultrasonic vibrations may be applied during shaping to affect shaping, bonding, and/or the molecular structure of the impressionable layer. In some embodiments, cooling, ultraviolet light, or other curing processes may be applied to promote retaining an impressed shape. The final shape of a conductive pattern may be formed by two or more shaping procedures, utilizing one or more templates. In some embodiments, templates may be applied to both sides of the circuit simultaneously or separately.

A template may be configured to position and/or attach a component on the circuit during shaping. Such a configuration, especially when ultrasonic vibrations are utilized, may improve production cost and efficiency. Additional conducting layers may be added to a circuit and may be cut and embossed if necessary.

Tooling

FIG. 6 shows an exemplary scorer 60, which can be used to define a pattern on a conducting layer. In the illustrated embodiment, scorer 60 is a substantially flat plate. In other embodiments, a scorer may take the form of a cylindrical roller. Scorer 60 includes a cutting edge 62 for scoring a conducting layer. In the illustrated embodiment, edge 62 is configured to define a spiral pattern corresponding to a planar coil, and therefore the edge has a spiraling shape. Other edge shapes may be used to produce different circuits. A scorer can have virtually any number of cutting edge segments, which can be separated from one another.

FIG. 7 shows a template 70 configured to shape an impressionable layer. In the illustrated embodiment, template 70 is a substantially flat plate. In other embodiments, a template may take the form of a cylindrical roller. Template 70 includes a stamping pattern 72 in the form of raised ridges. The raised ridges are shaped and positioned so that they can be aligned to contact between incisions made by scorer 60. The cross-sectional profile of the ridges can be shaped to create a desired impression in an impressionable layer. The somewhat rectilinear profile that is illustrated is provided as a nonlimiting example.

FIG. 8 shows an outline-cutting die 80 configured to cut a circuit into a desired shape. The outline-cutting die includes a cutting edge 82, which can be deep enough to cut entirely through a conducting layer, impressionable layer, substrate, cover layer, and/or any other included layers. The outline-cutting die can be used to remove unwanted material when such removal is desired. In some embodiments, an outline-cutting die and a scorer can be integrated into a single die. In some embodiments, the conducting layer, with or without the impressionable layer, may be pre-cut to one or more desired shapes prior to being layered with another layer. The use of an outline-cutting die is not required.

Post Shaping Processing

FIG. 9 shows a circuit 90 that has been defined with scorer 60, shaped with template 70, and trimmed with outline-cutting die 80. Circuit 90 is a nonlimiting example of the many possible circuits that can be formed according to the present disclosure. Circuit 90 includes a first node 92 at an inner end of a spiral 94. The circuit also includes a second node 96 at an outer end of spiral 94. As illustrated in FIG. 10, second node 96 can be folded into a position adjacent first node 92. A circuit may be folded to construct two opposing layers of a capacitor, a crossover, or virtually any other element. Folding a part of a circuit may be done before the initial shaping, between shaping steps, or at a later stage.

Roll-to-Roll Processing

Figure 11:
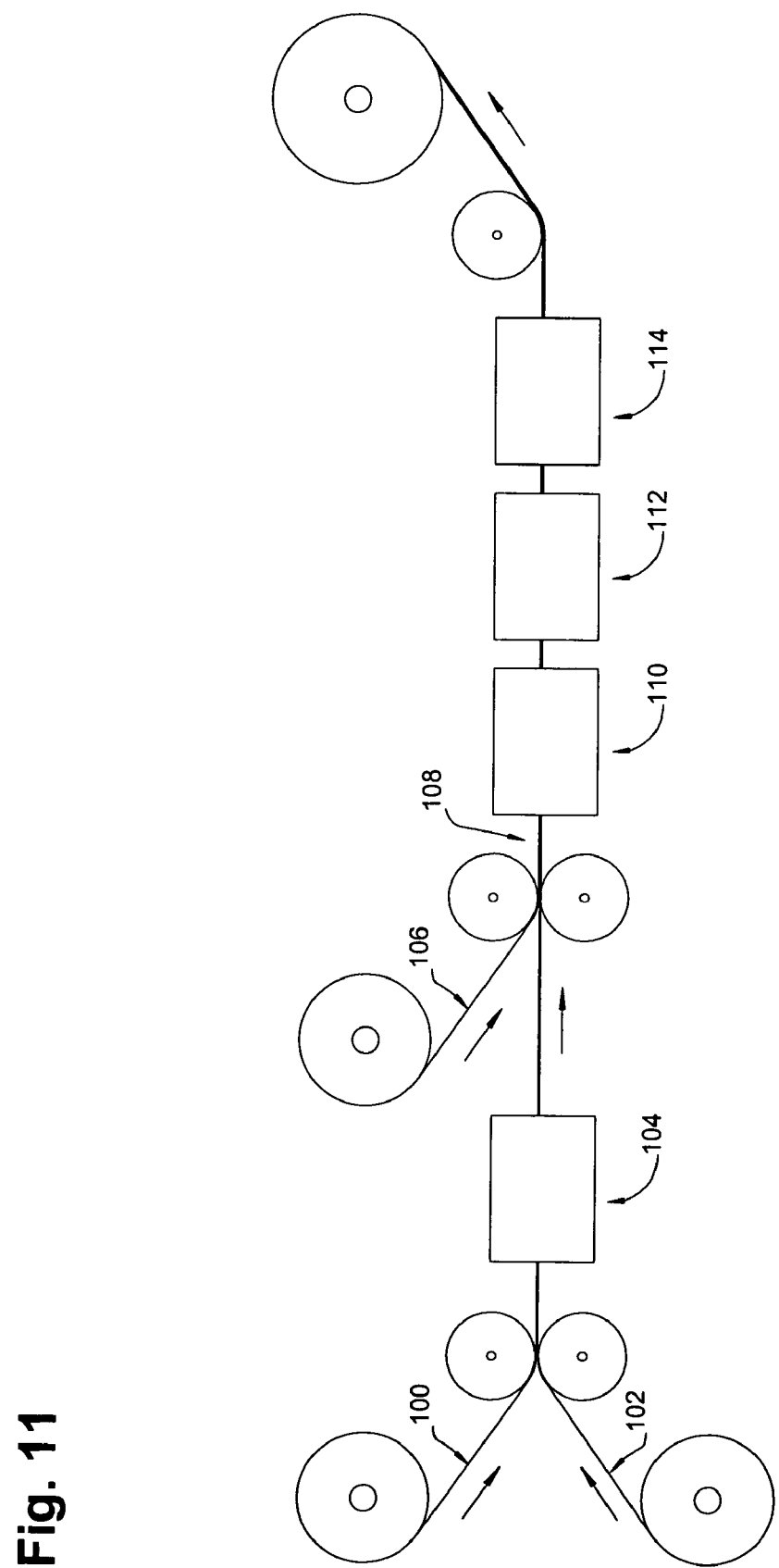
FIG. 11 somewhat schematically shows an exemplary roll-to-roll process for forming a circuit.

FIG. 11 schematically illustrates an exemplary process of circuit forming that utilizes roll-to-roll processing. Other processes, including other roll-to-roll processes, are also within the scope of this disclosure. The illustrated process is provided as a nonlimiting example of one suitable process. A conducting layer 100 and an impressionable layer 102 are laminated together and fed through a scoring station 104 where the conducting layer is scored. A top covering layer 106 may be added on top of the conducting layer. A web 108 including the conducting layer, the impressionable layer, and the covering layer can then move through a heating station 110 where the impressionable layer can be softened. The web can continue into a forming station 112 where the heated impressionable material can be shaped. The impressionable layer can be forced to shift during shaping resulting in a corresponding deformation of the conducting layer that can increase a gap between adjacent charge paths. The impressionable layer can hold the applied shape, thus retaining the gap between adjacent charge paths. The forming station may utilize templates and/or molds on one or both sides of the web. The web can be processed through a cooling station 114 to facilitate setting the newly formed circuit in a desired configuration. The circuits can then be further processed, such as being cut to a desired size.

Opposing Templates

Figure 12:
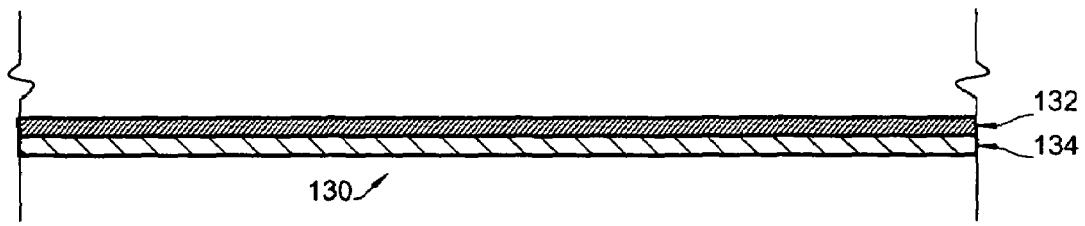
FIGS. 12–15 somewhat schematically show an exemplary method of forming a circuit with opposing templates.
Figure 13:
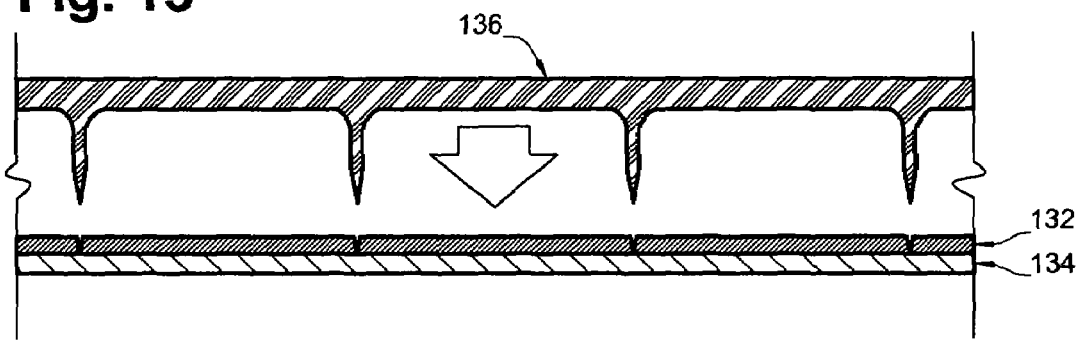
Figure 14:
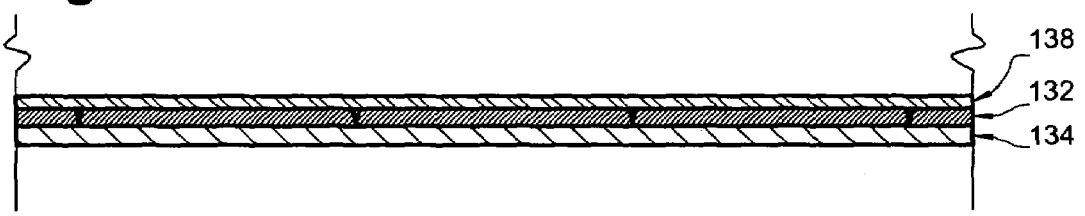
Figure 15:
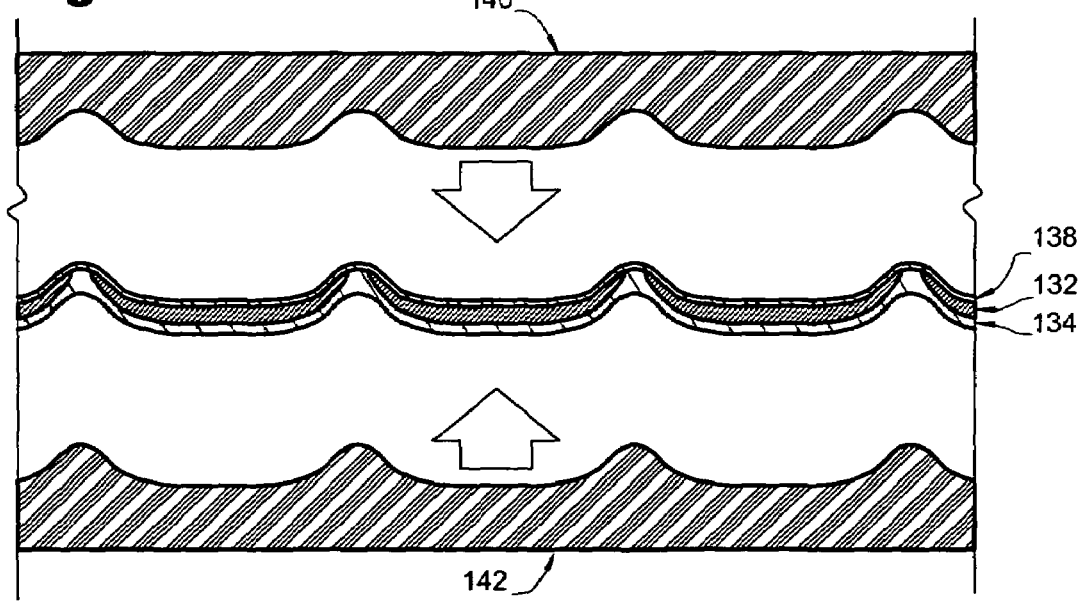

FIGS. 12–15 show another circuit-forming embodiment. In particular, FIG. 12 shows a laminated sheet 130 that includes a conducting layer 132 and an impressionable layer 134. In the illustrated embodiment, impressionable layer 134 also serves as a substrate. As shown in FIG. 13, the conducting layer can be scored by a scorer 136. FIG. 14 shows a cover layer 138 applied to sheet 130. FIG. 15 shows opposing templates 140 and 142 for shaping impressionable layer 134 and increasing a gap distance between adjacent traces of conducting layer 132. As with the other templates described herein, opposing templates can be substantially flat platen embossing dies, round dies suitable for roll-to-roll processing, or virtually any other template that can be used to deform the impressionable layer.

Thermal Adjustment Channels

Figure 16:
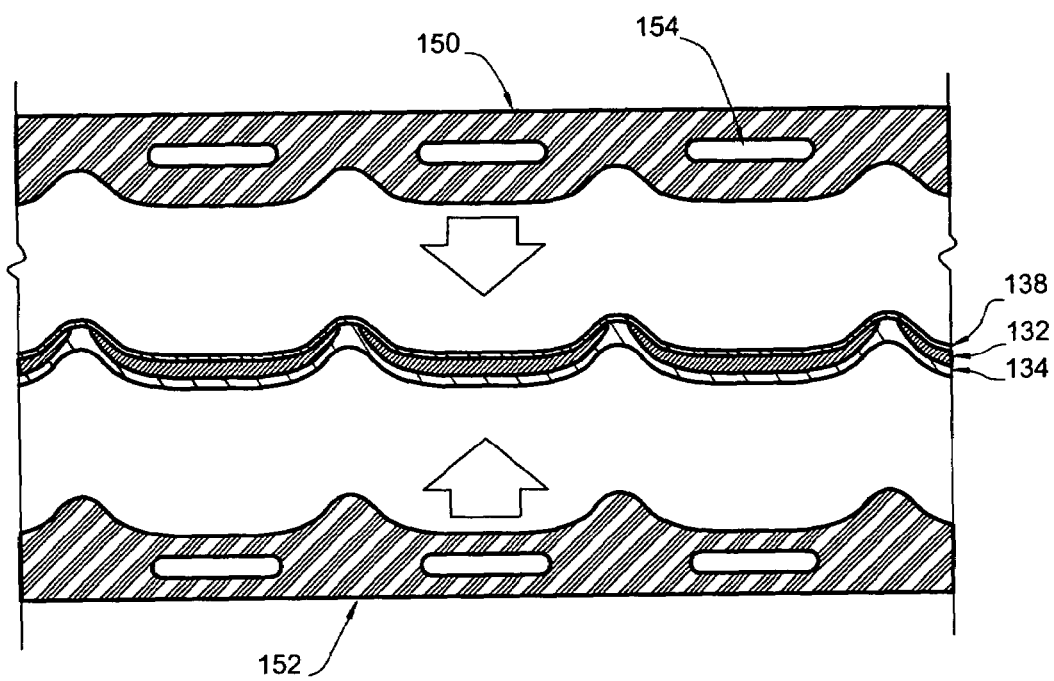
FIG. 16 somewhat schematically shows an exemplary template having thermal adjustment channels.

FIG. 16 shows another example of opposing templates 150 and 152 for shaping an impressionable layer. Templates 150 and 152 also include channels 154, through which a thermal adjustment fluid can pass. For example, a cooling fluid can be directed through channels 154, thus cooling the templates and facilitating the setting of a previously heated impressionable layer. In some embodiments, a warming fluid can be directed through the channels, thus softening an impressionable layer for shaping. While channels 154 are illustrated in the context of opposing templates 150 and 152, it should be understood that such channels can be incorporated into other templates while remaining within the scope of this disclosure. For example, such channels can be incorporated into flat templates, which can be used to change the pliability of an impressionable layer without necessarily shaping the impressionable layer. Furthermore, different templates that utilized thermal adjustment channels can be used in the same circuit-forming process. For example, some templates can be used to heat, while other templates are used to cool. It should be understood that thermal adjustment channels are provided as a nonlimiting mechanism for heating and/or cooling an impressionable layer.

Compound Template

Figure 17:
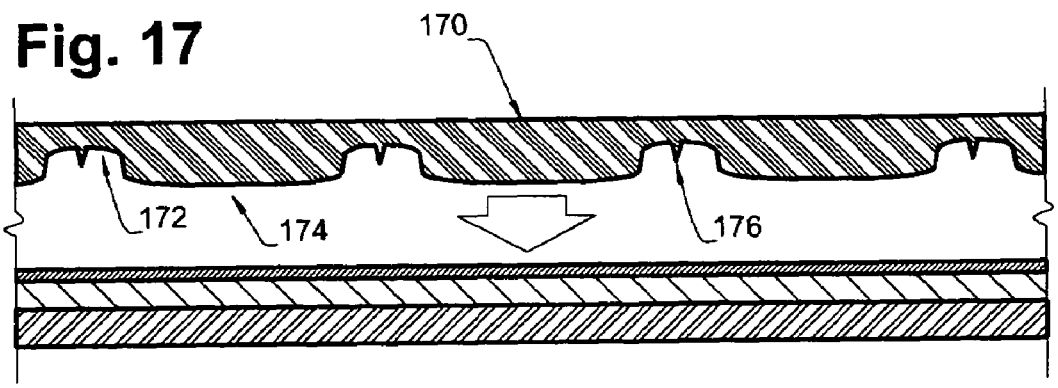
FIGS. 17–20 somewhat schematically show an exemplary method of forming a circuit with a compound template.
Figure 18:
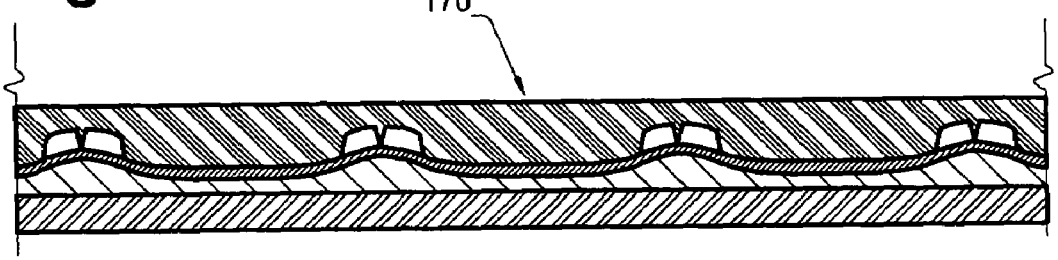
Figure 19:
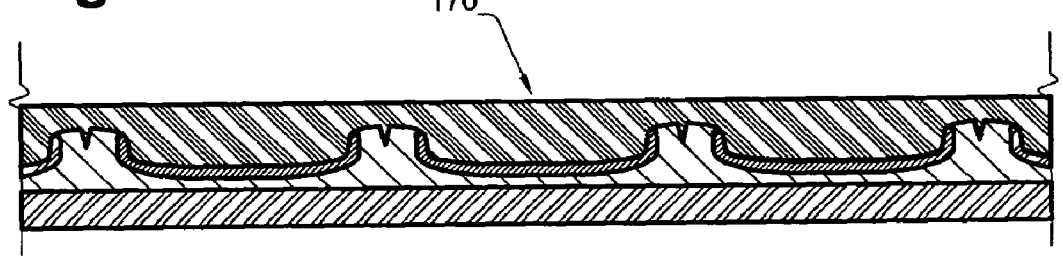
Figure 20:
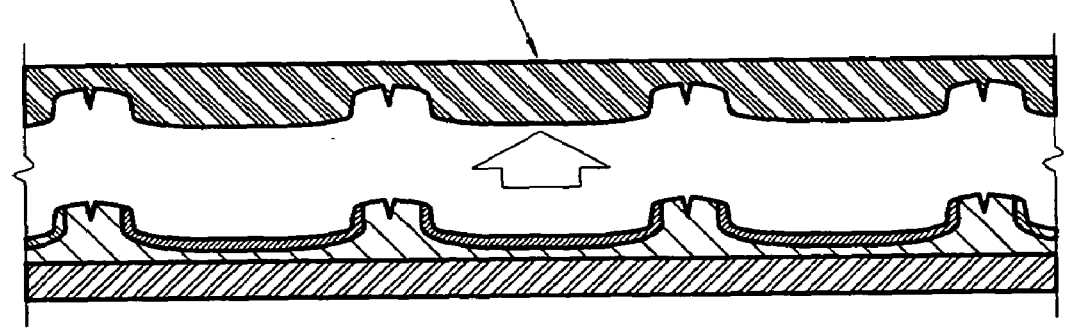

FIGS. 17–20 show another circuit-forming embodiment. In particular, FIG. 17 shows a compound template 170 that is configured to score a conductive layer. As with the previously illustrated templates, template 170 includes troughs 172 and ridges 174. The ridges and troughs provide a three-dimensional face that can be used to press an impressionable layer into a desired shape. Unlike the previously illustrated templates, troughs 172 include scoring edges 176. Instead of utilizing a separate scoring die for defining a circuit pattern in a conductive layer, edges 176 of template 170 can score the conductive layer. In other words, scoring and shaping can be consolidated into a single template. Such an arrangement can reduce the number of steps required to process a circuit and/or facilitate easy and accurate registration of the incisions made by the edge and the profile applied to the impressionable layer.

Narrow Stamping Template

Figure 21:
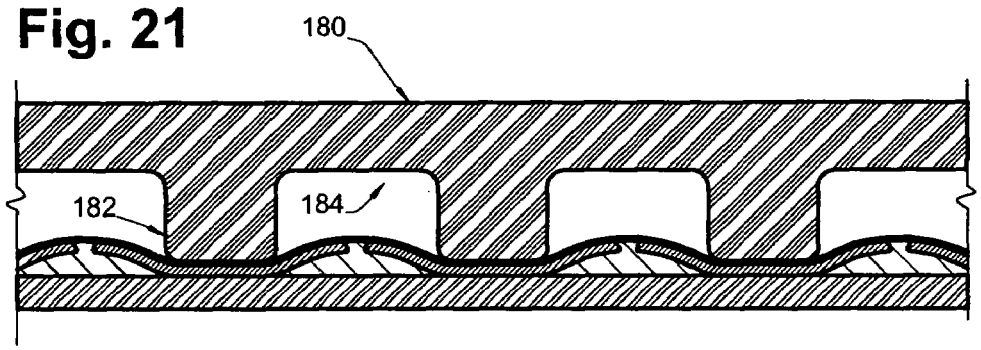
FIGS. 21–22 somewhat schematically show an exemplary method of forming a circuit with a narrow stamping template.
Figure 22:
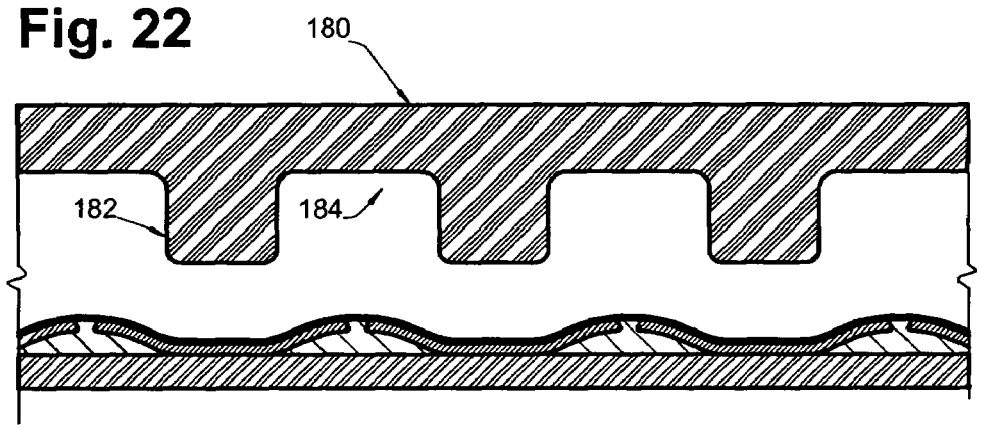

FIGS. 21–22 show a circuit-forming embodiment, which uses a template 180 that includes ridges 182 and troughs 184. Unlike the previously described templates, which are configured to press the impressionable layer into a profile that closely conforms to the shape of the template, template 180 is configured to press the impressionable layer into a desired shape, which does not necessarily completely conform to the shape of the template. In the illustrated embodiment, troughs 184 are sufficiently deep so that the impressionable layer does not fully occupy the entire trough when shaped. Furthermore, ridges 182 are relatively narrow and do not extend the entire distance between adjacent circuit gaps.

Template 180 can accommodate increased alignment tolerances with the pattern defined on a conductive layer. Forming some circuits, such as a planar coil, can require small tracks (about 1/32 of an inch or less) which means that the distance between blades is very small. Using a shaping template that allows for relaxed alignment tolerances can help speed production and/or improve formed circuit integrity.

Uncovered Gaps

Figure 23:
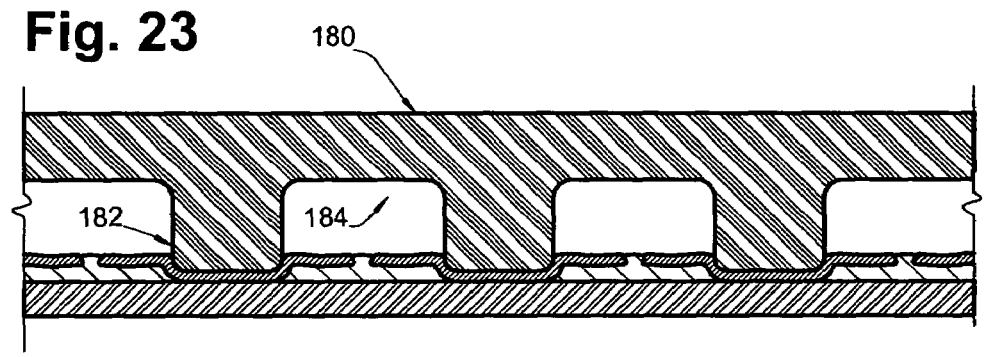
FIGS. 23–24 somewhat schematically show an exemplary method of forming a circuit with uncovered gaps.
Figure 24:
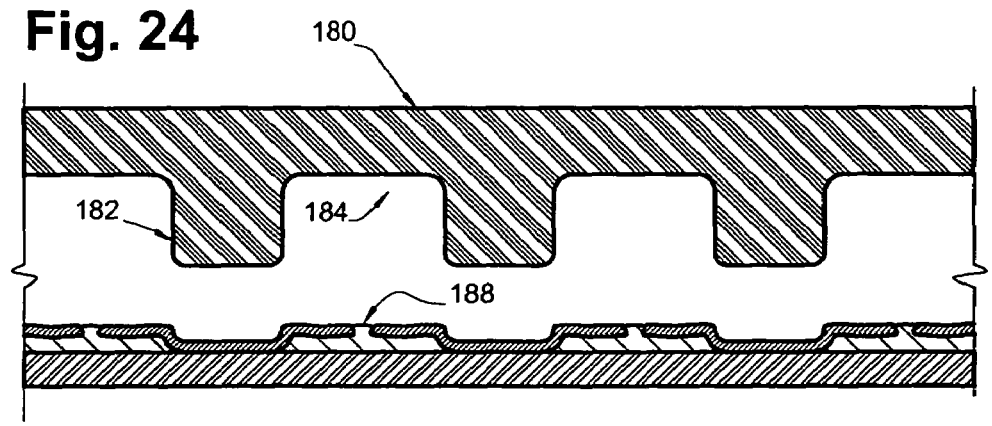
Figure 25:
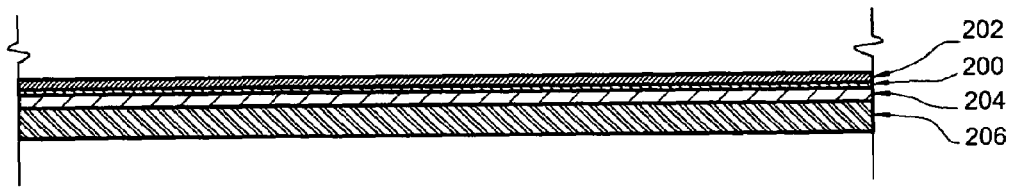
FIGS. 25–28 somewhat schematically show an exemplary method of forming a circuit with a flexible layer intermediate a conducting layer and an impressionable layer.
Figure 26:
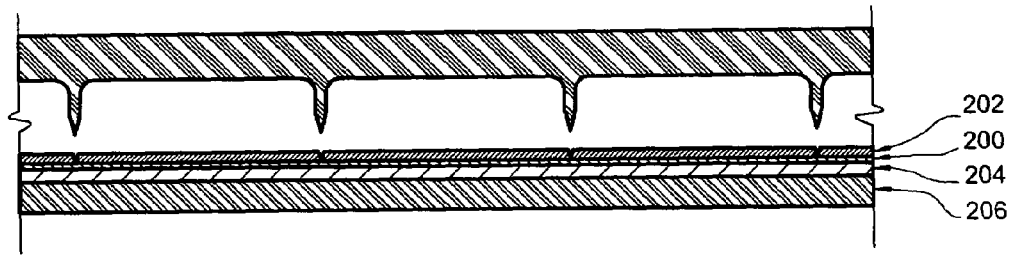
Figure 27:
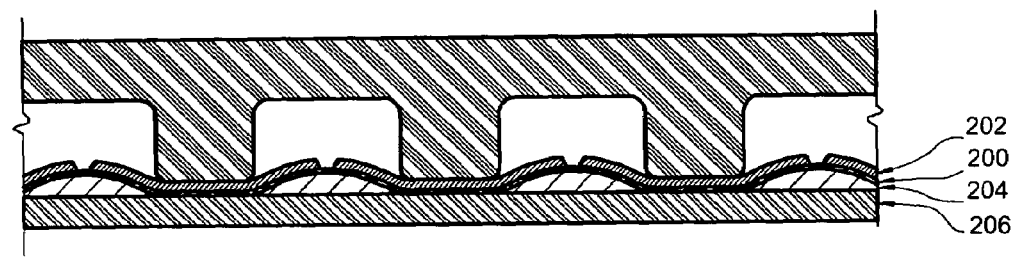
Figure 28:
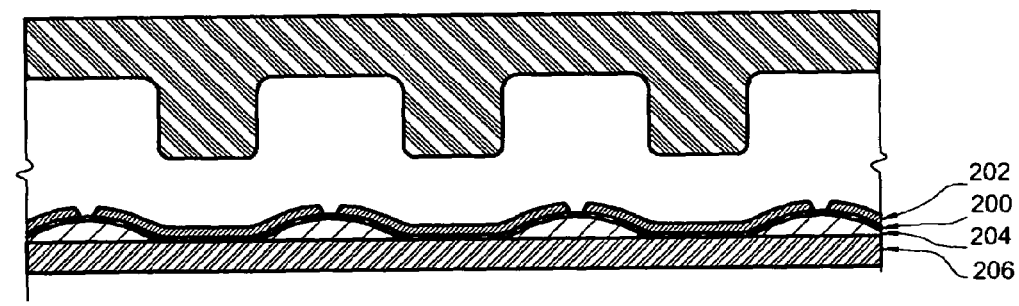

FIGS. 23–24 shows template 180 shaping a sheet that does not include a cover layer laminated over the impressionable layer. It should be understood that a cover layer is an optional component in some embodiments, and a template can be used to shape sheets that include cover layers as well as sheets that do not include cover layers. In addition to providing mechanical support and protection and/or electrical insulation to a circuit, a cover layer can affect the shape of a formed circuit. In the illustrated embodiment, the pressed sheet does not include a cover layer, and therefore the impressionable layer can squeeze through the gap between adjacent circuit traces (shown at 188). The material the squeezes through the gap can help maintain spacing between adjacent traces of the conducting layer. The size of troughs 184 can be designed to limit (or eliminate) impressionable material sticking to the die and may provide for cost savings over the use of a cover layer in some applications.

Intermediate Layer

FIGS. 25–28 show a circuit forming embodiment in which a flexible layer 200 is intermediate a conductive layer 202 and an impressionable layer 204, which is laminated to a substrate 206. Such an arrangement can improve the ability of the gaps to form because of the radius of the pressed flexible layer. The flexible layer can also limit (or eliminate) the impressionable layer from flowing through gaps in the conductive layer, if that is desired. The flexible layer can be selected to have a higher melting temperature than the impressionable layer, which can allow the flexible layer to stretch without breaking and/or flowing. In some embodiments, such as those in which the impressionable layer is relatively soft, a flexible layer can improve circuit integrity and formation efficiency.

Pre-Raised Substrate

Figure 29:
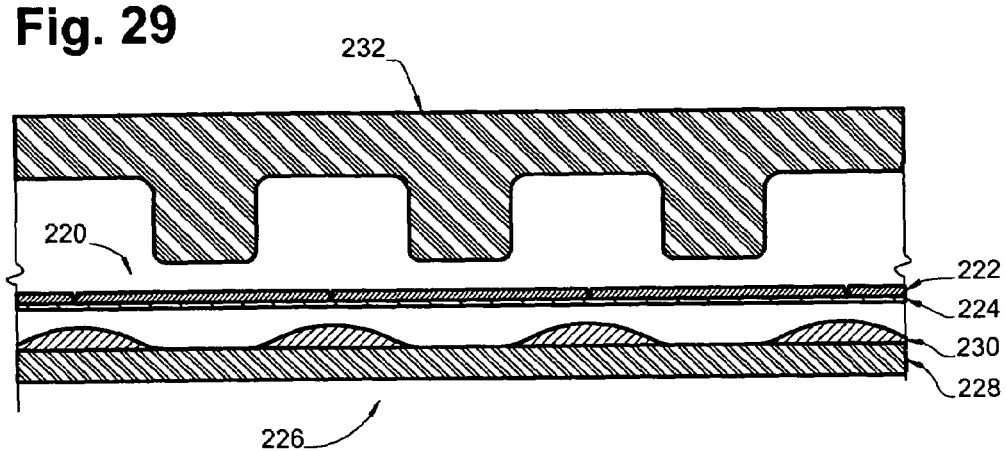
FIGS. 29–31 somewhat schematically show an exemplary method of forming a circuit with a pre-raised substrate.
Figure 30:
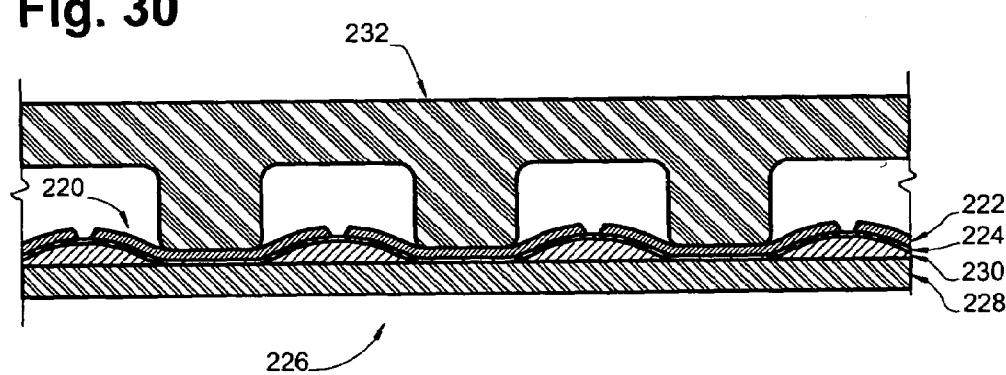
Figure 31:
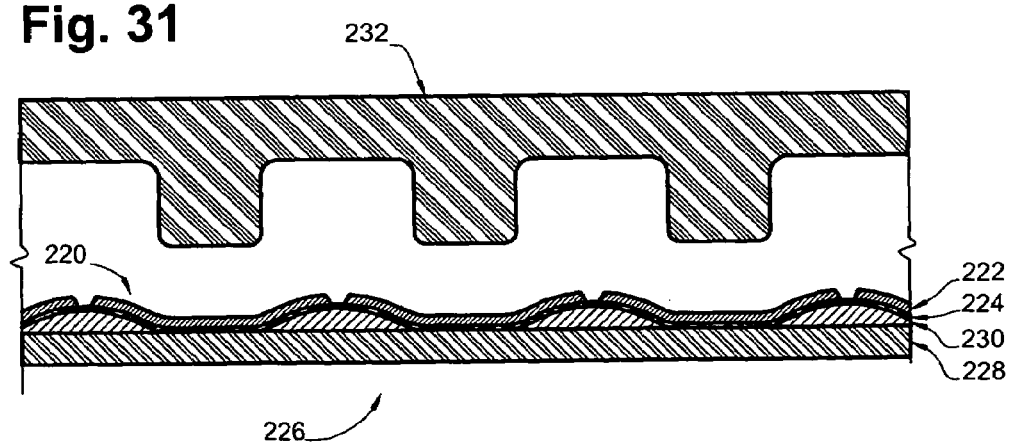

FIGS. 29–31 show a circuit forming embodiment in which a web 220 including a precut conductive layer 222 is laminated to an impressionable layer 224. In the illustrated embodiment, the impressionable layer is a relatively thin flexible layer configured to support the conducting layer. The impressionable layer may be a thermoplastic material, which can be suitable for heat activated bonding, or virtually any non-conductive material. The impressionable layer may be coated with adhesive such as pressure sensitive adhesive, or an adhesive may be applied to web 226. A separate web 226 includes a substrate 228 and raised features 230. Raised features 230 can include raised thermographic print, although this is not required. Virtually any raised substrate can be used, including substrates that are molded or formed with raised features and relatively flat substrates to which raised features are applied.

As shown in FIG. 30, a template 232 can press web 220 against web 226, causing impressionable layer 224 to deform and adhere to web 226. Raised features 230 can cause the impressionable layer to deform in a manner that increases a gap distance between adjacent traces of conductive layer 222. Furthermore, impressionable layer 224 can retain the acquired shape after being pressed to web 226, thus maintaining the increased gap between adjacent traces of the conducting layer. As with other embodiments, a cover layer may be applied to the conductive layer, thus insulating and/or protecting the conductive layer.

Vertical Gap

Figure 32:
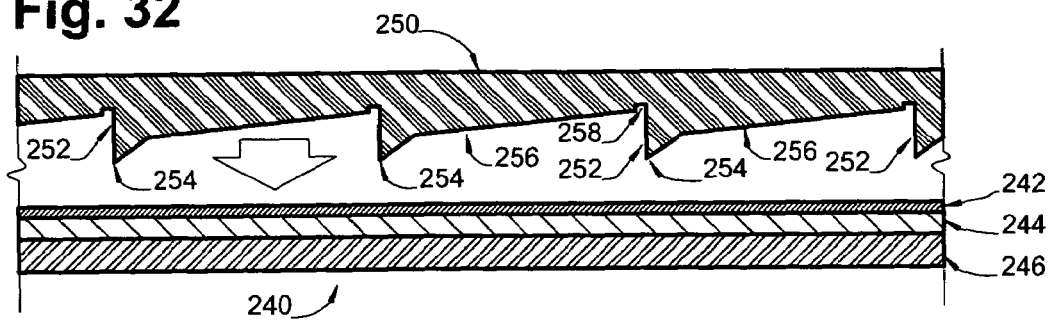
FIGS. 32–35 somewhat schematically show an exemplary method of forming a circuit with having a vertical gap.
Figure 33:
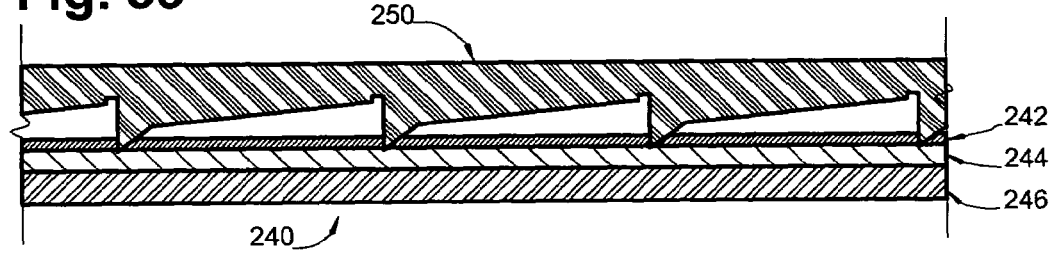
Figure 34:
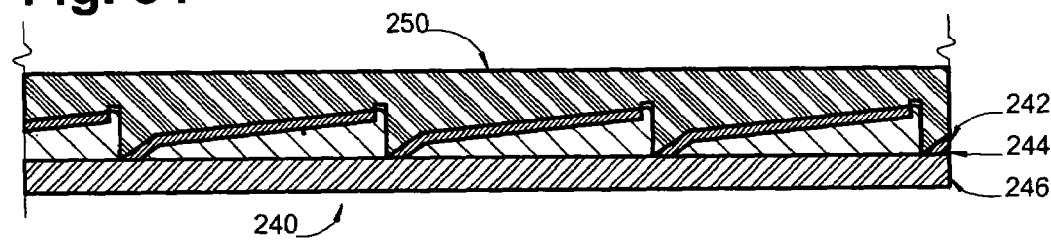

FIGS. 32–34 show a circuit-forming embodiment in which the conductive layer is defined so adjacent traces of the conducting layer are vertically spaced. In other words, adjacent edges are not on the same horizontal plane. In the illustrated embodiment, this is accomplished with a compound template, although this is not required. As used in this context, "vertical" refers to the relative spacing of the layered materials without considering any outside reference, such as the earth.

FIG. 32 shows a sheet 240 including a conducting layer 242, an impressionable layer 244, and a substrate 246. As shown in FIG. 33, a template 250 can be used to define the conducting layer and shape the impressionable layer. However, unlike the previously described templates, template 250 is configured to produce vertical gaps between adjacent traces of the conducting layer. In particular, template 250 includes ledges 252 that correspond to the gaps between adjacent traces. In a compound template, such ledges will be located at a cutting edge 254 of the template. In a noncompound template, such ledges will be positioned for alignment with gaps that are defined by another die. Template 250 also includes ramp portions 256 between adjacent ledges. The ramp portions can be variously shaped. In some embodiments, the template may also include slight recesses 258 at the base of the ledges.

As can be seen in FIGS. 32–35, when a template like template 250 is applied to sheet 240, a circuit pattern is defined on the conductive layer, and the impressionable layer is shaped so that adjacent traces of the conducting layer are separated by a gap distance V. However, unlike previously described gaps, this gap is primarily vertically orientated instead of horizontally orientated.

Circuit Leveling

Figure 36:
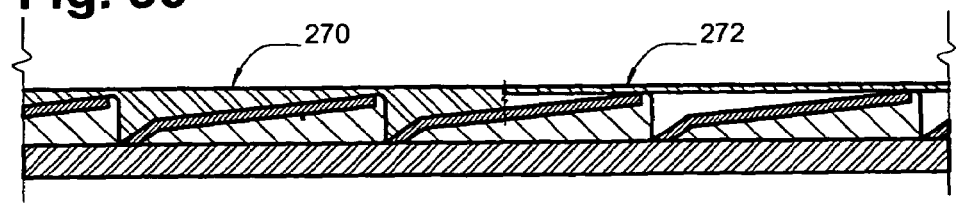
FIG. 36 somewhat schematically shows an exemplary method of forming a circuit with level cover layer.

FIG. 36 shows a circuit-forming embodiment in which a shaped circuit is covered with a level cover layer. In particular, a shaped circuit can be covered with a cover layer 270 that fills the profiled shape of formed circuit. Such a cover layer can be preshaped to fit the surface profile of a shaped circuit, or a deformable cover layer can be used to fill the shaped surface of the circuit. It should be understood that such a layer may not be required to maintain a desired gap between adjacent traces of a conducting layer. In some embodiments, a rigid cover layer 272 can be applied to a shaped circuit. Such a cover layer may be spaced from portions of the profiled surface of a shaped circuit. Although only shown applied to one surface of a shaped circuit, it should be understood that a level cover layer can be applied to opposite surfaces of a circuit. This may be particularly desired when opposing templates are used to shape the circuit. As with the other concepts illustrated and described above, a level cover layer can be applied to other shaped circuits, and is not limited to the particular embodiment in which it is described.

Although the present invention has been shown and described with reference to the foregoing operational principles and preferred embodiments, it will be apparent to those skilled in the art that various changes in form and detail may be made without departing from the spirit and scope of the invention. The variations described above are provided as nonlimiting examples, and aspects of the variations can be combined with one another while remaining within the scope of this disclosure. The present invention is intended to embrace all such alternatives, modifications and variances that fall within the scope of the appended claims.

What is claimed is:

1. A method of forming a circuit, comprising:
   layering an impressionable material and a conductive material;
   defining adjacent charge paths on the conductive material;

shaping the impressionable material to increase a gap between adjacent charge paths; and applying a cover layer on the conductive material.

2. The method of claim 1, wherein the cover layer is applied before shaping the impressionable material.

3. The method of claim 1, wherein the cover layer has a different melting temperature than the impressionable layer.

4. The method of claim 1, wherein the cover layer is preshaped, and wherein shaping the impressionable material includes pressing the preshaped cover layer against the conductive material.

5. The method of claim 1, further comprising attaching a circuit component to a charge path of the conducive material, wherein the cover layer is applied to the circuit component.

6. A method of forming a circuit, comprising:
layering an impressionable material and a conductive material;
defining adjacent charge paths on the conductive material; and
shaping the impressionable material to increase a gap between adjacent charge paths, wherein shaping the impressionable material includes depressing portions of the impressionable material and permitting other portions of the impressionable material to swell.

7. The method of claim 6, wherein defining adjacent charge paths includes cutting through the conductive material.

8. The method of claim 6, wherein defining adjacent charge paths includes cutting partially through the conductive material.

9. The method of claim 6, wherein defining adjacent charge paths includes cutting the conductive material into a coil shaped pattern.

10. The method of claim 6, wherein shaping the impressionable material includes softening the impressionable material.

11. The method of claim 6, wherein shaping the impressionable material includes heating the impressionable material.

12. The method of claim 6, wherein shaping the impressionable material includes stamping the impressionable material with a template.

13. The method of claim 6, wherein shaping the impressionable material includes stamping the impressionable material between opposing templates.

14. The method of claim 6, wherein the portions of the impressionable material that are permitted to swell are located where cuts are made in the conductive material.

15. The method of claim 6, wherein shaping the impressionable material produces an ascending edge on a charge path of the conductive layer.

16. The method of claim 6, wherein shaping the impressionable material results in an edge of a charge path of the conductive layer moving in a direction opposite of a stamping force.

17. The method of claim 6, wherein shaping the impressionable material further includes creating a vertical gap between adjacent edges of the adjacent charge paths.

18. The method of claim 6, wherein shaping the impressionable layer further includes setting the impressionable material to maintain the increased gap.

19. The method of claim 6, further comprising attaching a circuit component to a charge path of the conducive material.

20. A method of forming a circuit, comprising:
layering an impressionable material and a conductive material;
defining adjacent charge paths on the conductive material; and
shaping the impressionable material to increase a gap between adjacent charge paths, wherein shaping the impressionable layer includes setting the impressionable material to maintain the increased gap, and wherein setting the impressionable material includes cooling the impressionable material with a template that shapes the impressionable material.

21. A method of forming a circuit, comprising:
layering an impressionable material and a conductive material;
defining adjacent charge paths on the conductive material; and
shaping the impressionable material to increase a gap between adjacent charge paths;
wherein the defining and the shaping are performed by a compound template configured to cut the conductive material and deform the impressionable material.

22. The method of claim 21, wherein the compound template produces an ascending edge on at least one of the adjacent charge paths.

23. A method of forming a circuit, comprising:
layering an impressionable material and a conductive material, and a flexible layer intermediate the conductive material and the impressionable material;
defining adjacent charge paths on the conductive material; and
shaping the impressionable material to increase a gap between adjacent charge paths.

24. The method of 23, wherein the flexible layer has a higher melting temperature than the impressionable material.

25. A method of forming a circuit, comprising:
layering an impressionable material and a conductive material;
defining adjacent charge paths on the conductive material; and
shaping the impressionable material to increase a gap between adjacent charge paths;
wherein the layering, defining, and shaping are performed in a roll-to-roll process.

26. Tho method of claim 25 A method of forming a circuit, comprising:
layering an impressionable material and a conductive material;
defining adjacent charge paths on the conductive material;
shaping the impressionable material to increase a gap between adjacent charge paths; and
attaching a circuit component to a charge path of the conducive material, wherein a shaping template is utilized in attaching the circuit component.

27. The method of claim 26, wherein the circuit component is positioned in contact with the conductive material before shaping.

28. A method of forming a circuit, comprising:
layering an impressionable material and a conductive material;
defining adjacent charge paths on the conductive material; and
shaping the surface profile of the impressionable material to raise an edge of at least one of the adjacent charge paths.

29. The method of claim 28, wherein adjacent edges of the adjacent charge paths are raised.

30. The method of claim 28, wherein alternating edges of adjacent charge paths are raised.

31. A method of forming a circuit, comprising:
    laminating a layer of conductive material from a first roll with a layer of impressionable material from a second roll to form a web;
    cutting a circuit pattern at least partially through the conductive material;
    applying pressure to the web to establish a desired gap distance between adjacent charge paths of the conductive material.

32. The method of claim 31, further comprising adding a covering layer from a third roll to the web.

33. The method of claim 32, wherein the covering layer is added before applying pressure.

* * * * *